(12) United States Patent
Murphy et al.

(10) Patent No.: US 9,775,261 B2
(45) Date of Patent: Sep. 26, 2017

(54) FLEXIBLE CHASSIS INTERFACE DEVICE

(71) Applicant: THE BOEING COMPANY, Chicago, IL (US)

(72) Inventors: Timothy F. Murphy, Chesterfield, MO (US); David M. Baczewski, Moscow Mills, MO (US); Dennis M. Hayes, Ballwin, MO (US); Barry Sommer, Collinsville, IL (US)

(73) Assignee: The Boeing Company, Chicago, IL (US)

( * ) Notice: Subject to any disclaimer, the term of this patent is extended or adjusted under 35 U.S.C. 154(b) by 741 days.

(21) Appl. No.: 14/222,849

(22) Filed: Mar. 24, 2014

(65) Prior Publication Data

US 2015/0253160 A1 Sep. 10, 2015

Related U.S. Application Data

(60) Provisional application No. 61/948,972, filed on Mar. 6, 2014.

(51) Int. Cl.
| | |
|---|---|
| *G06F 1/16* | (2006.01) |
| *H05K 5/00* | (2006.01) |
| *H05K 7/00* | (2006.01) |
| *H05K 7/14* | (2006.01) |
| *G01R 1/04* | (2006.01) |
| *B64F 5/60* | (2017.01) |
| *G01R 31/00* | (2006.01) |

(52) U.S. Cl.
CPC ............. *H05K 7/1461* (2013.01); *B64F 5/60* (2017.01); *G01R 1/04* (2013.01); *G01R 31/008* (2013.01)

(58) Field of Classification Search
CPC .. H05K 7/1461; H05K 7/1422; H05K 9/0069; B64F 5/60; G01R 1/04; G01R 1/0408; G01R 31/282
USPC .......... 439/268; 324/537, 538; 361/724–728; 73/865.9
See application file for complete search history.

(56) References Cited

U.S. PATENT DOCUMENTS

| 4,334,193 A | * | 6/1982 | Gordy | ............... | G01R 31/3658 |
|---|---|---|---|---|---|
| | | | | | 324/426 |
| 6,257,911 B1 | * | 7/2001 | Shelby | ............... | H01R 13/2421 |
| | | | | | 439/268 |
| 7,227,365 B2 | * | 6/2007 | Machado | ........... | G01R 31/2808 |
| | | | | | 324/537 |
| 8,254,131 B2 | * | 8/2012 | Babcock | ............ | G01R 31/2808 |
| | | | | | 361/679.02 |

(Continued)

*Primary Examiner* — Anthony Haughton
(74) *Attorney, Agent, or Firm* — Perman & Green, LLP

(57) ABSTRACT

An apparatus including an environmentally protective chassis configured to house and environmentally protect a test chassis having one or more module interfaces, the environmentally protective chassis having an interface device seating surface with sealable apertures formed in the interface device seating surface; and at least one interface device configured for connection to the test chassis and including at least one interface connector corresponding to connectors of a unit under test, the at least one interface device being configured for insertion through one or more of the sealable apertures and direct coupling to the interface device seating surface of the environmentally protective chassis without any intervening environmental interface or environmental interface plane located between the interface device seating surface and the test chassis.

35 Claims, 9 Drawing Sheets

(56) References Cited

U.S. PATENT DOCUMENTS

| | | | |
|---|---|---|---|
| 2004/0160226 A1* | 8/2004 | Ewing | G01R 31/2808 324/538 |
| 2006/0097714 A1* | 5/2006 | Machado | G01R 31/2808 324/756.05 |
| 2010/0156434 A1* | 6/2010 | Okino | G01R 31/2886 324/537 |
| 2011/0163755 A1* | 7/2011 | Jiang | G01R 31/2808 324/537 |

* cited by examiner

FLEXIBLE CHASSIS INTERFACE DEVICE

CROSS-REFERENCE TO RELATED APPLICATIONS

This application is a non-provisional of and claims the benefit of U.S. provisional patent application No. 61/948,972 filed on Mar. 6, 2014, the disclosure of which is incorporated by reference herein in its entirety.

BACKGROUND

Generally test equipment for various units under test includes a test chassis or primary test instrument, such as for example, a PXI chassis and corresponding control electronics. In some instances the PXI chassis is housed within an environmental housing to protect the PXI chassis from the test environment making connections between a unit under test and the PXI chassis difficult. Conventional environmental housings and the connection to the unit under test provided using the conventional environmental housings are either complicated or are not easily expanded for future applications due to, for example, intensive wiring connections and the customized nature of those connections. With conventional test equipment, once a major test platform is fielded it may be difficult to make additions to the test station to address future technical needs, due to, for example inflexibility of test station hardware and software and the cost(s) involved in making such a change. For example, in one aspect straight through wiring is utilized to connect the primary test instrument to connectors disposed on the front panel of a test instrument interface. The straight through wiring does not lend itself to easy expansion for new capabilities and it makes repair/maintenance of the test system difficult as removal of the circuit cards from the primary test instrument requires removing the wiring and manipulating the cards through an opening in the environmental housing. In another aspect, to connect the primary test instrument to the unit under test, a mass interconnect panel is utilized however, utilization of the mass interconnect panel involves increased cost to the end user due to, for example, use of unique interface adapters (to which test equipment interfaces are mounted) that are required to connect the test equipment interfaces to the housing for each system, which are not easily updated in the field for new applications.

It would be advantageous to have a flexible chassis interface device that provides capability to expand, change and/or reconfigure a testing system while making the testing system more maintainable and repairable.

SUMMARY

Accordingly, apparatus and method, intended to address the above-identified concerns, would find utility.

In accordance with one or more aspects of the present disclosure an apparatus includes an environmentally protective chassis configured to house and environmentally protect a test chassis having one or more module interfaces, the environmentally protective chassis having an interface device seating surface with sealable apertures formed in the interface device seating surface; and at least one interface device configured for connection to the test chassis and including at least one interface connector corresponding to connectors of a unit under test, the at least one interface device being configured for insertion through one or more of the sealable apertures and direct coupling to the interface device seating surface of the environmentally protective chassis without any intervening environmental interface or environmental interface plane located between the interface device seating surface and the test chassis.

In accordance with one or more aspects of the present disclosure a method includes disposing a test chassis within an environmentally protective chassis; affixing an interface device to a circuit card; and installing the interface device and circuit card as a unit to the environmentally protective chassis such that the circuit card engages the test chassis and the interface device directly engages an interface device seating surface of the environmentally protective chassis.

BRIEF DESCRIPTION OF THE DRAWINGS

Figure 1:
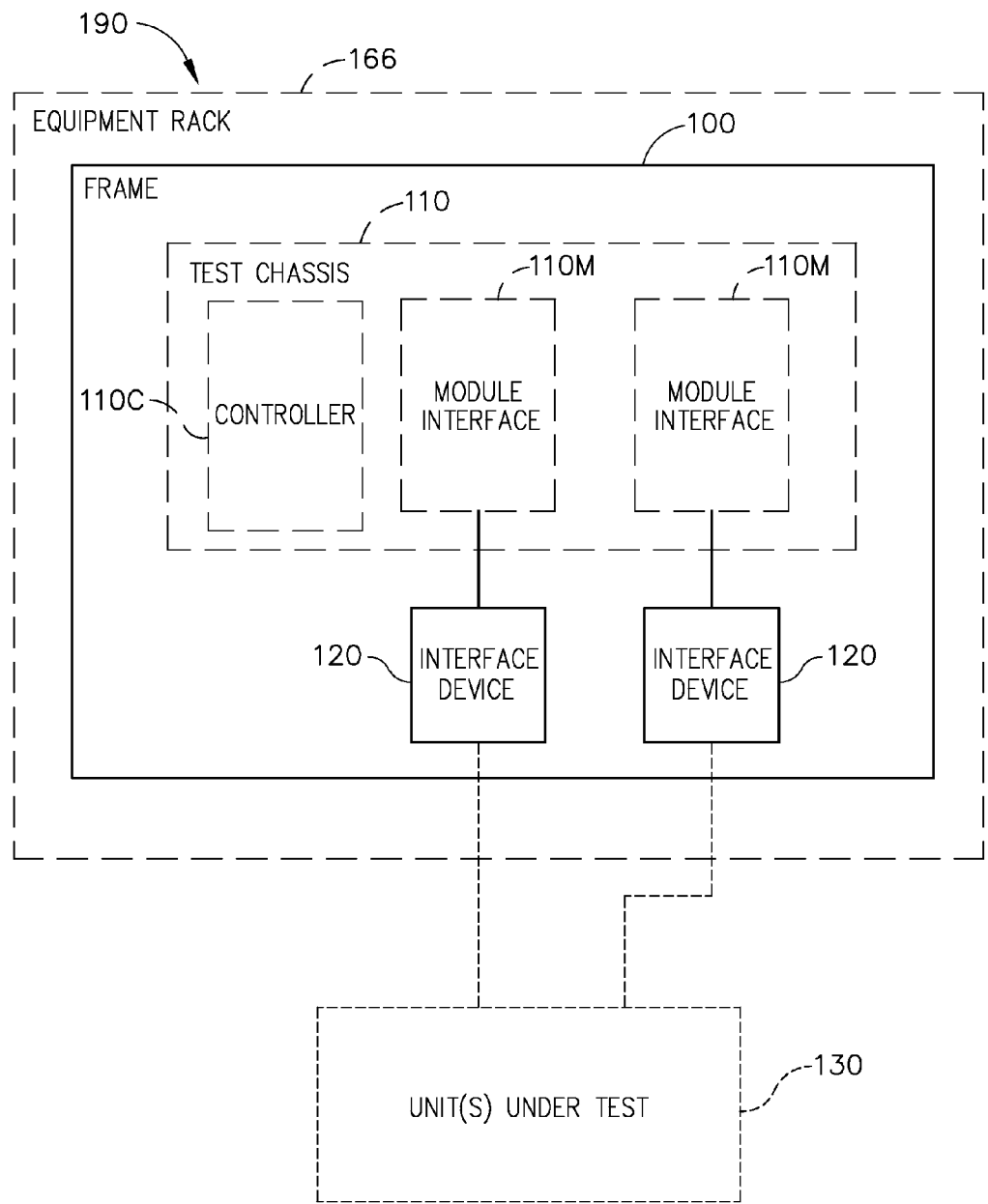
Figure 2A:
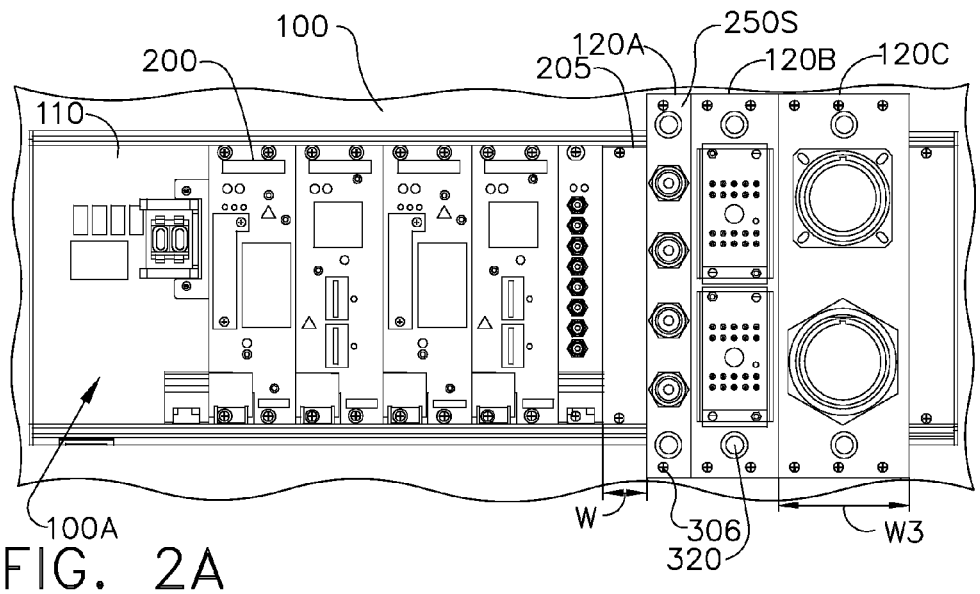
Figure 2B:
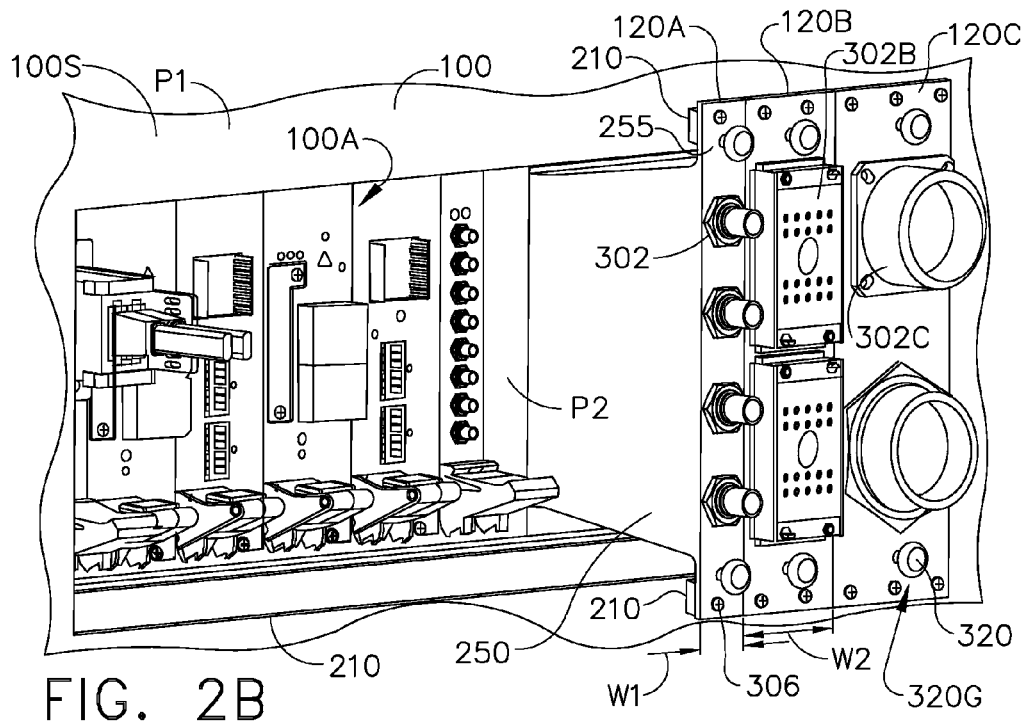
Figure 3A:
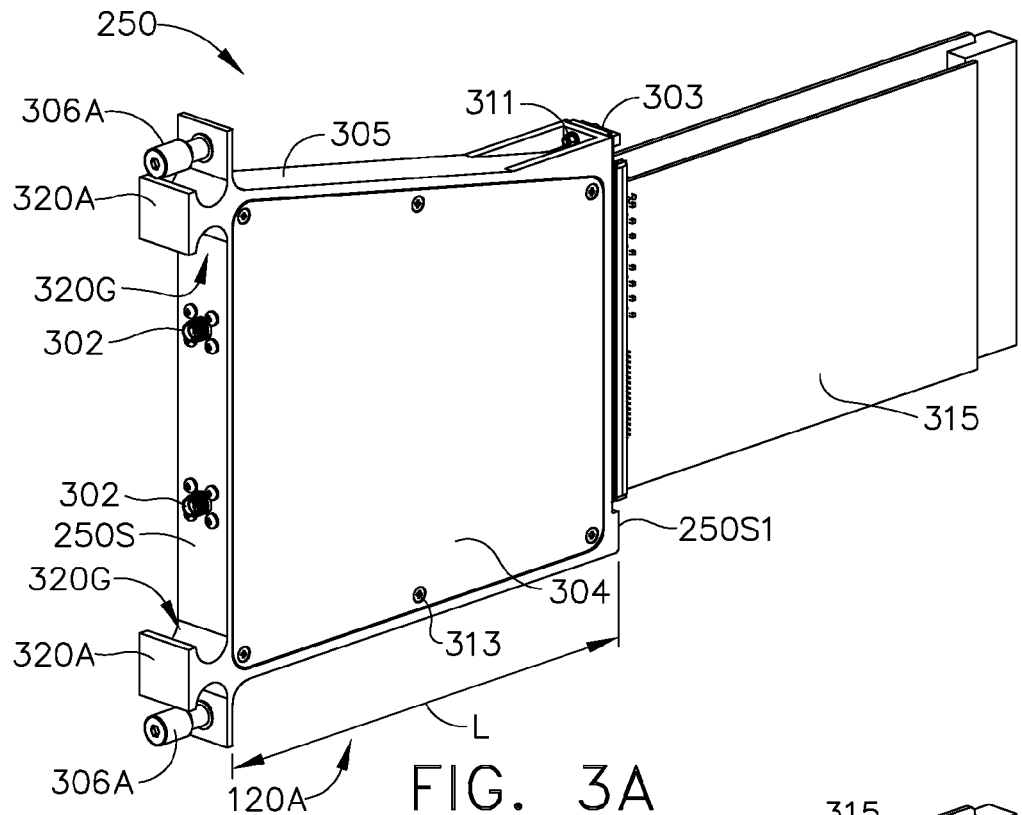
Figure 3B:
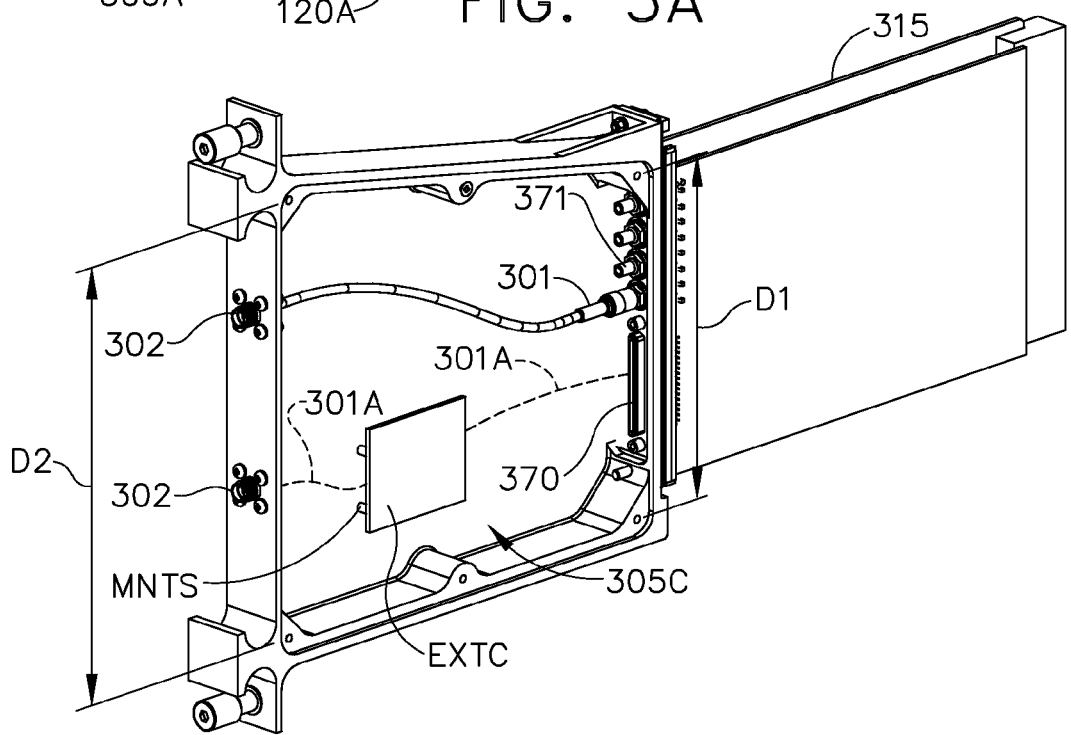
Figure 3C:
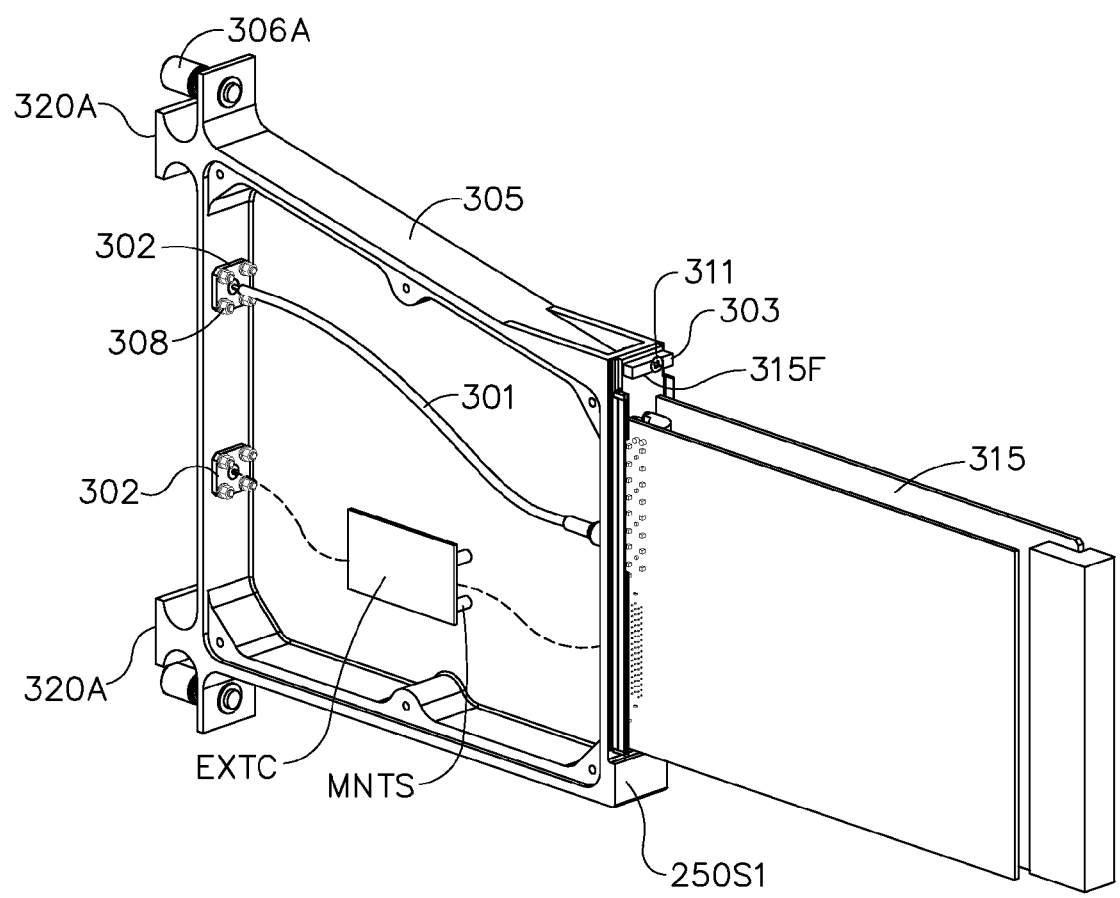
Figure 4A:
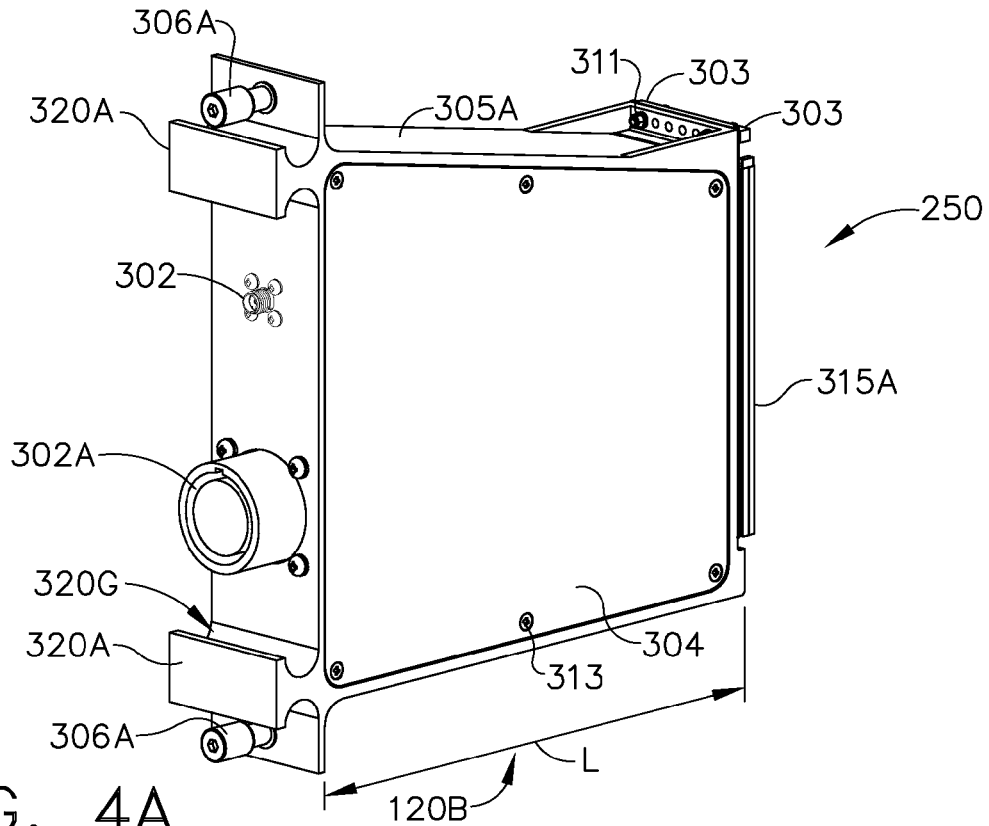
Figure 4B:
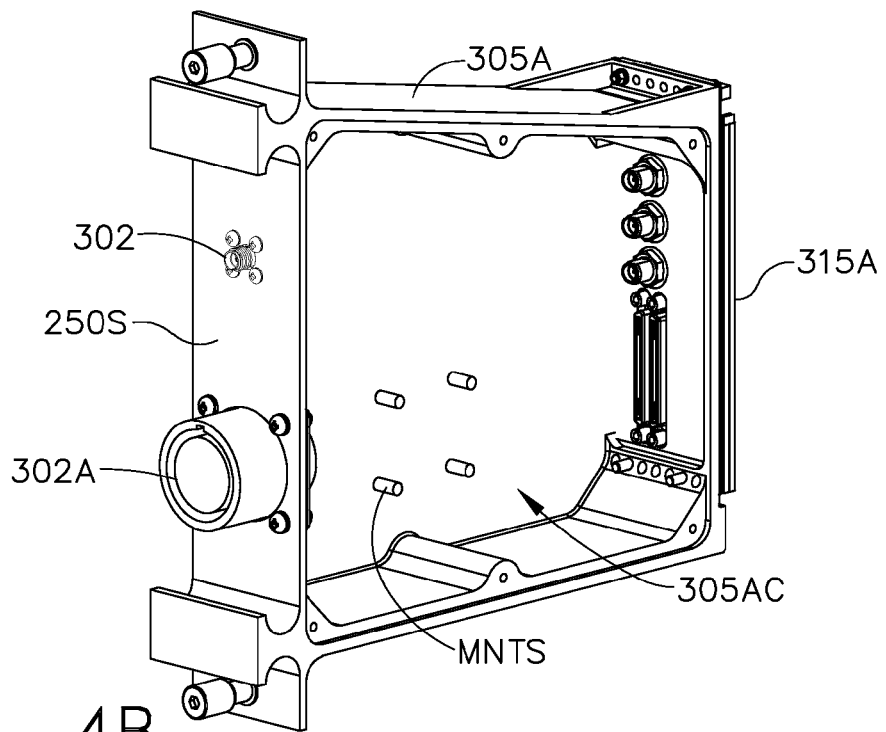
Figure 4C:
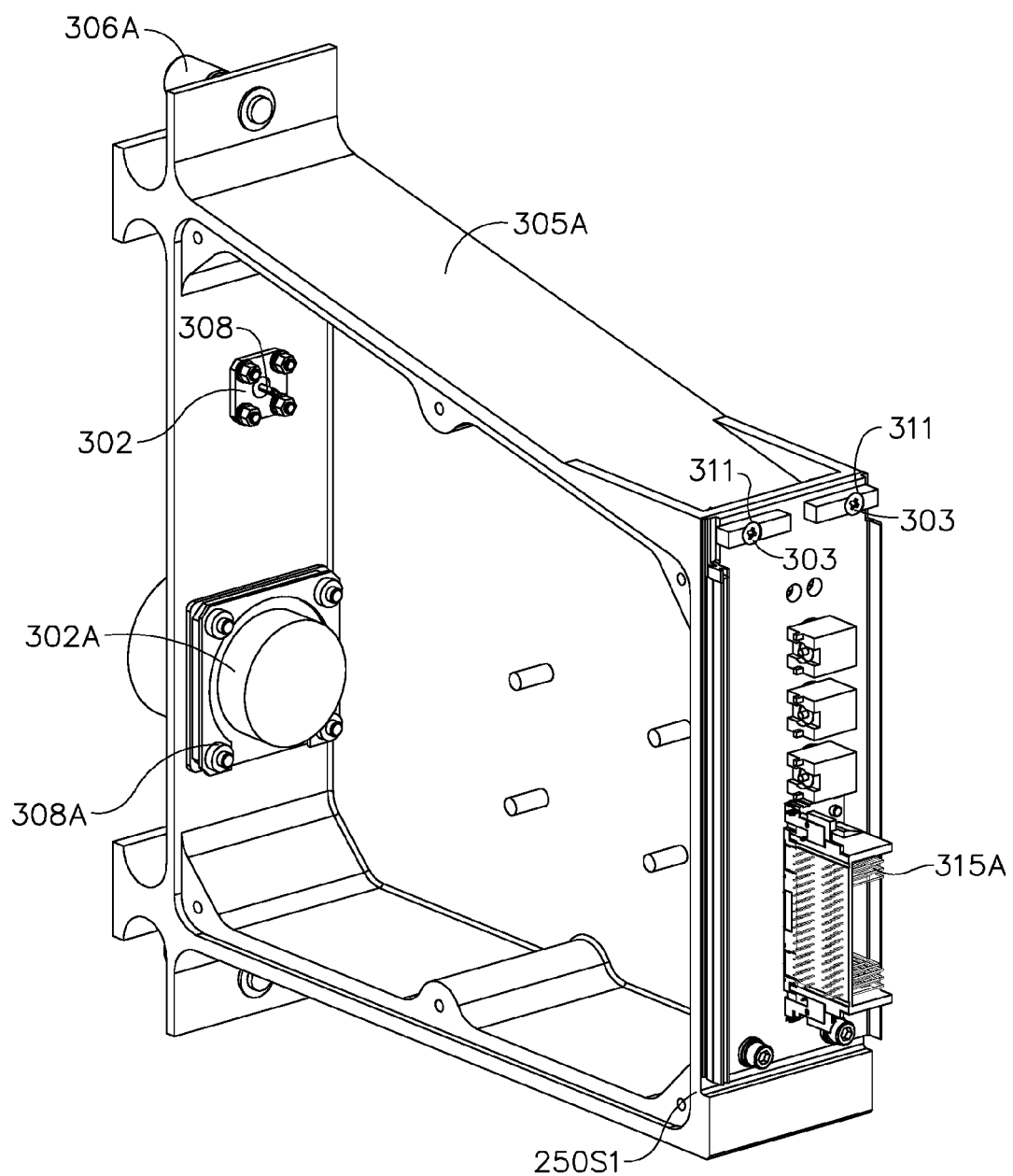
Figure 5:
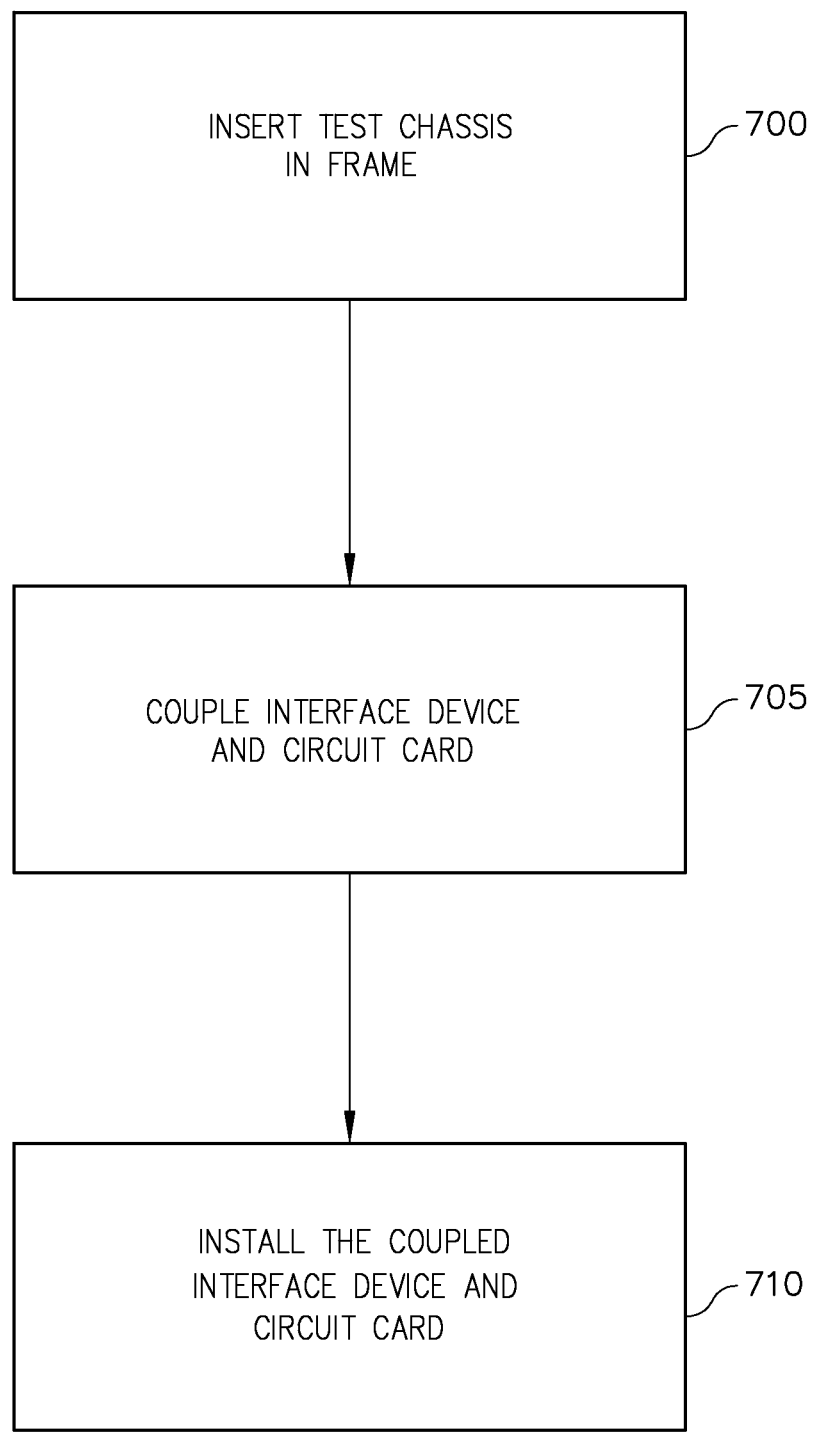
Figure 6:
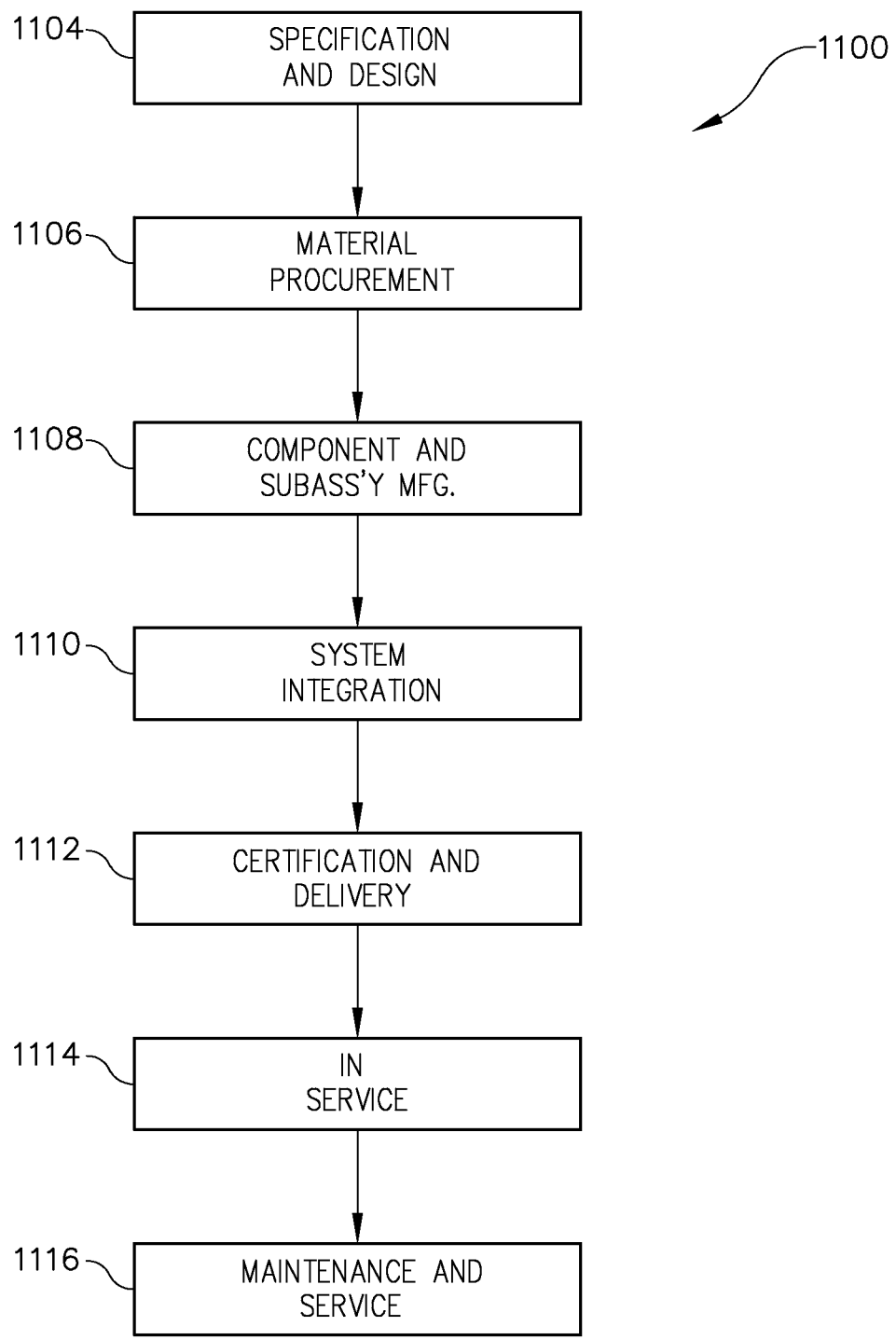

Having thus described examples of the disclosure in general terms, reference will now be made to the accompanying drawings, which are not necessarily drawn to scale, and wherein like reference characters designate the same or similar parts throughout the several views, and wherein:

FIG. 1 is a block diagram of a test system in accordance with aspects of the present disclosure;

FIG. 2A is a schematic plan view of a portion of a chassis interface device in accordance with aspects of the present disclosure;

FIG. 2B is a schematic perspective view of a portion of the chassis interface device of FIG. 2A in accordance with aspects of the present disclosure;

FIG. 3A is a perspective view of a portion of the chassis interface device of FIG. 2A in accordance with aspects of the present disclosure;

FIG. 3B is a perspective view of a portion of the chassis interface device of FIG. 3A in accordance with aspects of the present disclosure;

FIG. 3C is a perspective view of a portion of the chassis interface device of FIG. 3A in accordance with aspects of the present disclosure;

FIG. 4A is a perspective view of a portion of the chassis interface device of FIG. 2A in accordance with aspects of the present disclosure;

FIG. 4B is a perspective view of a portion of the chassis interface device of FIG. 4A in accordance with aspects of the present disclosure;

FIG. 4C is a perspective view of a portion of the chassis interface device of FIG. 4A in accordance with aspects of the present disclosure;

FIG. 5 is a flow diagram in accordance with aspects of the present disclosure;

FIG. 6 is a flow diagram of aircraft production and service methodology; and

Figure 7:
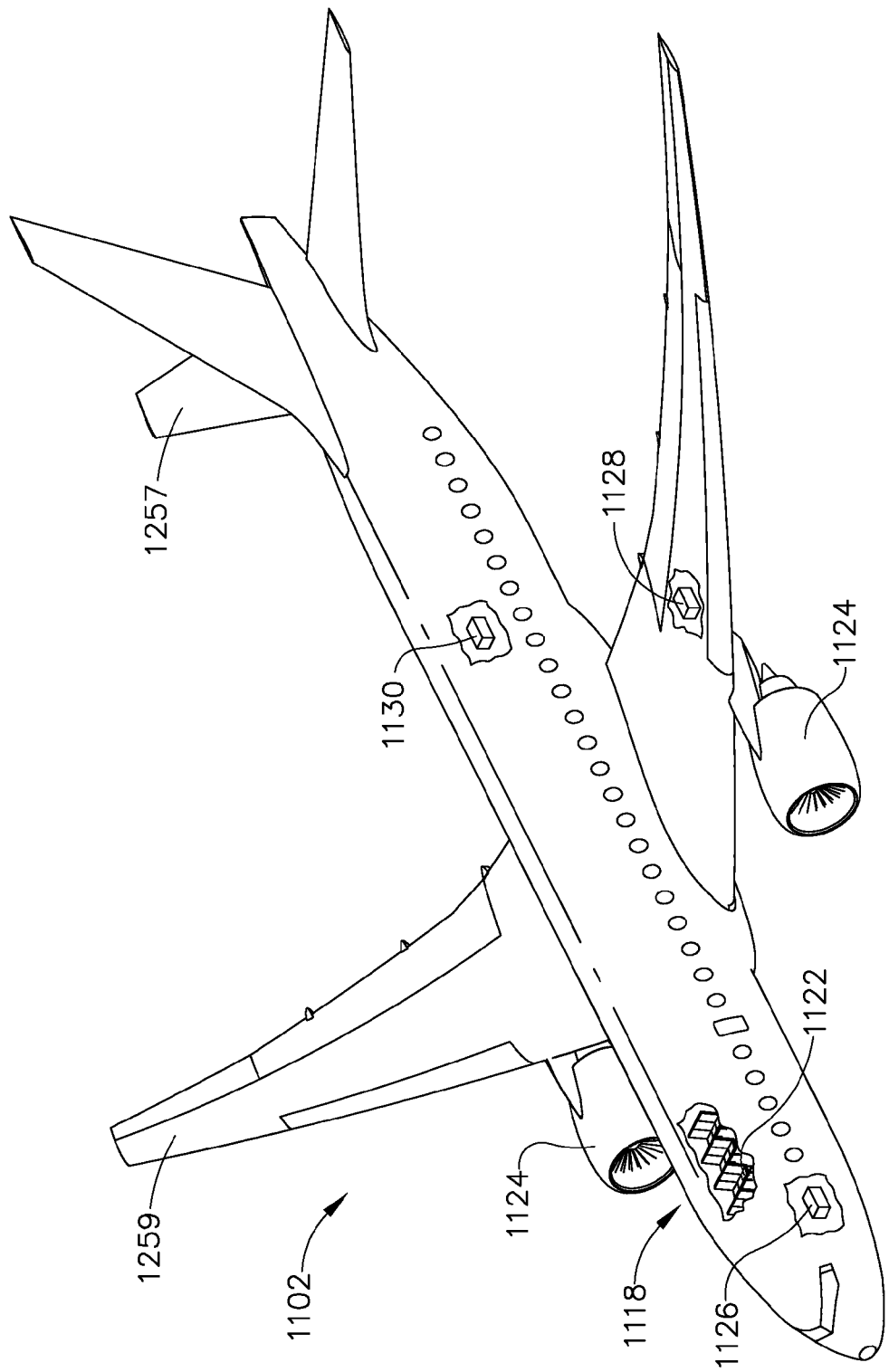

FIG. 7 is a schematic illustration of an aircraft.

In the block diagram(s) referred to above, solid lines connecting various elements and/or components may represent mechanical, electrical, fluid, optical, electromagnetic and other couplings and/or combinations thereof. As used herein, "coupled" means associated directly as well as indirectly. For example, a member A may be directly associated with a member B, or may be indirectly associated therewith, e.g., via another member C. Couplings other than those depicted in the block diagrams may also exist. Dashed lines, if any, connecting the various elements and/or components represent couplings similar in function and purpose to those represented by solid lines; however, couplings represented by the dashed lines are either selectively provided or relate to alternative or optional aspects of the disclosure. Likewise, any elements and/or components, represented with dashed lines, indicate alternative or optional aspects of the disclosure. Environmental elements, if any, are represented with dotted lines.

DETAILED DESCRIPTION

Referring to FIG. 1, a test system 190 in accordance with aspects of the present disclosure is illustrated. In one aspect the test system 190 includes a test chassis 110 disposed within a frame 100 where the frame is configured for insertion into an equipment rack 166. In other aspects, the frame may be placed on, for example, a work surface or any other suitable surface rather than into an equipment rack. The test chassis 110 may be any suitable primary test instrument such as for example, a PXI chassis, a VXI chassis or other suitable circuit card based test chassis. The test chassis 110 may include any suitable controller 110C which may be disposed integrally with the test chassis or located remotely from the test chassis. The test chassis 110 may also include one or more module interfaces or circuit card slots 110M for connecting any suitable unit under test 130 to the controller 110C as will be described below. The aspects of the present disclosure provide the ability of a test rack to interface directly with cables that go directly to the unit under test eliminating the need to hard-wire an interface with a backplane or purchase of generic equipment which requires interconnect adapters/cables.

The frame 100 may be a closed frame that substantially surrounds the test chassis 110 and be constructed of any suitable material. The frame 100 may form any suitable environmental housing having a closed interior space in which the test chassis 110 is located. In one aspect the frame 100 may include any suitable number components that are fastened together in any suitable manner, such as by mechanical or chemical fasteners, welding, brazing, etc. The frame 100 may be configured to as an environmentally protective chassis that environmentally protects the test chassis 110 from, for example, heat, moisture, particulates or any other environmental factor within a predetermined test environment while allowing a direct connection between the interface device(s) 120 and the test chassis 110 without any intervening mounting structure to which the interface device(s) are mounted. The frame 100 may include any suitable connectors and or seals for providing connections between the test chassis 110 and components external to the frame 100. For example, where the controller 110C is located remotely from the test chassis 110, the frame 100 may include suitable connectors for connecting the remote controller to the test chassis 110. Referring also to FIGS. 2A and 2B, the frame 100 may include an interface device mounting/seating surface 100S (e.g. a front panel/surface of the frame 100) including one or more apertures 100A into which one or more interface devices 120 are inserted for connecting the unit under test 130 to the test chassis 110. While a single rectangular aperture 100A is illustrated in the figures it should be understood that more than one aperture 100A having any suitable shape and size may be provided in the frame 100.

As described above, the interface devices 120 (e.g. interface devices 120A, 120B, 120C) may be inserted through the aperture 100A for directly interfacing with the test chassis 100 such that the interface devices 120 are mounted directly to interface device mounting surface 100S of the frame 100 (e.g. without any intermediary bracketry, receivers, adapters, etc.) for insertion of one or more respective circuit card into the test chassis 110 and form a suitable seal with the frame 100 for environmentally closing or sealing the aperture 100A. It is noted that the circuit card may be, for example, a PXI circuit card, a VXI circuit card or any other suitable circuit card corresponding to the test chassis being used. The interface device mounting surface 100S of the frame 100 defines an environmental interface plane P1 and the interface devices 120 extend between the environmental interface plane P1 (e.g. the interface device mounting/seating surface 100S) and a front plane or interface surface P2 (e.g. a front surface of the test chassis that forms openings in which the circuit cards are inserted) of the test chassis 110 without any intervening environmental interface or environmental interface plane located between the interface device mounting/seating surface 100S and the interface surface P2 of the test chassis 110. It is noted that the each module interface 110M of the test chassis 110 has a predetermined width W. The interface devices 120A, 120B, 120C may be provided in varying widths to accommodate any suitable predetermined connectors and circuit cards. For example, interface device 120A may be referred to as a single wide interface device, as a width W1 of the interface device is substantially equal to the width W of a single module interface 110M. Interface device 120B may be referred to as a double wide interface device as a width W2 of the interface device is substantially equal to the width W of two module interfaces 110M. Interface device 120C may be referred to as a triple wide interface device as a width W3 of the interface device is substantially equal to the width W of three module interfaces 110M. It is note that the interface devices 120 may have any suitable width corresponding to the width of any suitable number of module interfaces 110M depending on, for example, the connectors and circuit cards to be affixed to a respective interface device 120 (e.g. interface device 120A has connectors 302 sized to fit within one module interface width W, interface device 120B has connectors 302B sized to fit within two module interface widths W and interface device 120C has connectors 302C sized to fit within three module interface widths W). Any suitable number of connectors may be mounted to the interface devices.

As can be seen in FIGS. 2A and 2B the housing 250 may include one or more flanges 255 that extend around a periphery of the aperture 100A. The flanges 255 may be configured with one or more apertures through which any suitable fastener(s) 306 may extend for securing the housing 250 to the frame 100. In one aspect the fastener(s) 306 may be any suitable screw, thumb screw, bolt, snap or any other suitable fastener that allows removal of the interface device from the frame 100. Referring to FIG. 3A, in one aspect the fastener(s) may be a captive fastener(s) 306A such that the fastener(s) is non-removably secured to the housing (e.g. is captive within the aperture of the housing 250 through which the fastener passes). Still referring to FIGS. 2A and 2B the housing 250 may also include one or more protrusions 320 that extend from a surface 250S (e.g. a connector mounting surface) of the housing 250. The one or more protrusions 320 may be disposed on a surface 250S of the housing 250 that is a common surface for mounting the connectors 302, 302A (FIGS. 4A, 4A and 4C), 302B, 302C. In other aspects the one or more protrusions may be mounted to any suitable surface of the housing 250 where the protrusions are accessible by a user when the interface device 102A, 120B, 120C is mounted to the frame 100. The surface 250S and hence, the one or more protrusions 320 and connectors 302, 302A, 302B, 302C may be accessible to a user when the interface device 120A, 120B, 120C is mounted to the frame 100. Each protrusion 320 may include a recessed surface 320G or have any suitable contour and/or surface features configured to allow gripping of the protrusion 320. As may be realized, the one or more protrusions 320 may be configured (e.g. through the recessed surface 320G or other suitable contour and/or surface features) as handles or knobs that facilitate the insertion and removal of the interface device 120A, 120B, 120C to and from the frame 100 (e.g. through the front panel of the frame 100) and hence, insertion and removal of the respective circuit card(s) to and from the test chassis 110. In one aspect the one or more protrusions 320 may be affixed to the housing 250 in any suitable manner, such as by mechanical or chemical fasteners. Referring to FIGS. 3A-4C, in other aspects the one or more protrusions 320 may be integrally formed with the housing 250.

Any suitable seals 210 may be provide around the aperture 100A and/or on the housing 250 or flanges 255 of the interface device 120A, 120B, 120C to provide a predetermined seal between the interface device 120A, 120B, 120C and the frame to at least in part effect the environmental protection of the test chassis 110. The seals 210 may be any suitable seals constructed of any suitable material. Blank panels or covers 205 may also be provided to cover or otherwise seal one or more portions of the aperture 100A not occupied by the one or more interface devices 120A, 120B, 120C. The blank panels 205 may also be provided as single wide, double wide and triple wide panels. In other aspects the panels may have any suitable width corresponding to the width W of any suitable number of module interfaces 110M.

Referring now to FIGS. 3A-3C, a single wide interface device 120A will be described in greater detail. As described above, the interface device 120A includes a housing 250 having any suitable shape and size so that the interface device 120A extends through the aperture 100A for connecting one or more circuit cards 315 to the module interface 110M of the test chassis 110. In one aspect the housing 250 includes a frame 305 having a circuit card mounting surface 250S1 (e.g. a first end plate that includes connectors that align and mate connectors disposed on a front plate of the circuit card and includes at least one mechanical attachment device for engaging the circuit card) and a connector mounting surface 250S (e.g. a second end plate opposite the first end plate, the second end plate is configured with connectors corresponding with connectors of a unit under test). In this aspect the connector mounting surface 250S and the circuit card mounting surface 250S1 are disposed on opposite longitudinal ends of the frame 305. The frame 305 may also form or otherwise include a cavity 305C that is accessible from at least one lateral side of the frame 305. The cavity 305C may have any suitable shape and size for housing any suitable connectors 301, 301A (described below) and/or any suitable external circuitry EXTC corresponding to the circuit card 315 coupled to the interface device 120A. In one aspect a circuit card 315 may require external circuitry EXTC for interfacing the circuit card 315 to a unit under test 130. As an example, a side of the cavity 305C that is common to the circuit card mounting surface 250S1 may have a first dimension D1 and a side of the cavity 305C that is common to the connector mounting surface 250S may have a second dimension D2 where the second dimension is larger than the first dimension D1 to provide suitable space within the cavity for housing the external circuitry EXTC and the connectors 301A for connecting the external circuitry EXTC to the circuit card 315. In another aspect the dimensions D1 and D2 may be substantially the same. The cavity may include any suitable mounts MNTS for mounting the external circuitry EXTC within the cavity. A width of the interface device may also be increased (e.g. double wide, triple wide, etc.) to provide suitable space for the external circuitry EXTC. One or more covers 304 may be removably secured/attached to the frame 305 in any suitable manner to seal or otherwise close the cavity 305C. In one aspect the cover 304 may be secured to the frame using mechanical fasteners 313.

One or more suitable connectors 302 may be mounted to the connector mounting surface 250S (e.g. front surface) in any suitable manner. In one aspect mechanical fasteners 308 may be used to secure/attach the one or more connectors 302 to the frame 305. Any type of connector (e.g. MIL-STD-38999, Hypertronix, 12, etc.) may be mounted to the frame 305 depending on a width (e.g. single wide, double wide, triple wide, etc.) of the frame 305. One or more circuit cards 315 may be coupled to the circuit card mounting surface 250S1 in any suitable manner. In one aspect one or more retaining blocks 303 may be placed over one or more flanges 315F of the circuit card 315. Any suitable fastener 311 may extend through retaining block(s) 303 and the corresponding flange(s) 315F for securing of the circuit card 315 to the frame 305. In other aspects, retaining blocks 303 may not be used where the fastener 311 includes a sufficient coverage area over the flange(s) 315F of the circuit card. Any suitable connectors 301, 301A (e.g. wire, cable, flat or ribbon cable, etc.) may substantially directly connect one or more connectors 370, 371 (e.g. circuit card connectors) of the circuit card 315 to a respective connector 302 (e.g. interface connectors) on the connector mounting surface 250S. In one aspect the connectors 301, 301A may also connect the external circuitry EXTC to a respective connector 302 and the circuit card 315. The connectors 301, 301A may have ends that correspond to the connectors 370, 371, 302 or any other ends suitable for connection to, for example, the external circuitry EXTC and other connection ports of the circuit card 315. Removal of the cover 304 from the frame 305 provides access to the connectors 301 for any suitable purpose such as repair, replacement, or reconfiguring of the interface device 120A.

Referring to FIGS. 4A, 4B and 4C a double wide interface device 120B is illustrated having a substantially similar configuration to that described above with respect to interface device 120A, as such similar features are referred to by like reference numerals. Here the connector mounting surface 250S of the frame 305A includes two connectors 302, 302A but in other aspects any suitable number of connectors may be provided on the connector mounting surface 250A of the interface devices 120A, 120B, 120C. As can be seen in FIGS. 4A, 4B and 4C the connector 302A is a double wide connector that is secured to the frame in any suitable manner, such as by fasteners 308A. It is also noted that the circuit card 315A may be secured to the circuit card mounting surface using any suitable number of fasteners 311 (and retaining blocks 303).

It is noted that a longitudinal length L of the interface device housing 250 is such that the housing 250 extends between the interface device mounting surface 100S of the frame 100 and the test chassis 110. The housing 250 may be configured in any suitable manner to seal or otherwise close one or more openings corresponding to one or more module interfaces 110M of the test chassis. For example, the circuit card mounting surface 250S1 of the housing 250 may have dimensions substantially similar to dimensions of one or more module interface 110M so as to form a cover over a respective one or more module interfaces 110M. The length L may be any suitable predetermined length for allowing connection/coupling between the circuit card attached to the housing 250 and the test chassis.

The disclosure and drawing figures describing the operations of the method(s) set forth herein should not be interpreted as necessarily determining a sequence in which the operations are to be performed. Rather, although one illustrative order is indicated, it is to be understood that the sequence of the operations may be modified when appropriate. Accordingly, certain operations may be performed in a different order or simultaneously. Additionally, in some aspects of the disclosure, not all operations described herein need be performed.

Referring to FIG. 5, in operation the test chassis 110 may be disposed within the frame 100 (e.g. a secondary chassis) that is operable to provide a protective environment for the test chassis 110 as well as the module interface(s) 110M of the test chassis (FIG. 5, Block 700). A circuit card 315, 315A may be affixed or otherwise coupled to an interface device 120 (FIG. 5, Block 705), where a first end plate of the interface device includes connectors that align and mate connectors disposed on a front plate of the circuit card and includes at least one mechanical attachment device for engaging the circuit card, the interface device includes a second end plate opposite the first end plate where the second end plate is configured with connectors corresponding with connectors of a unit under test 130. The circuit card 315, 315A and the attached interface device 120 are installed as a unit in the frame 100 such that the circuit card 315, 315A engages the test chassis 110 and the interface device substantially directly mechanically engages the frame 100 (FIG. 5, Block 710).

Examples of the disclosure may be described in the context of an aircraft manufacturing and service method 1100 as shown in FIG. 6 and an aircraft 1102 as shown in FIG. 7. During pre-production, illustrative method 1100 may include specification and design 1104 of the aircraft 1102 and material procurement 1106. During production, component and subassembly manufacturing 1108 and system integration 1110 of the aircraft 1102 take place. Thereafter, the aircraft 1102 may go through certification and delivery 1112 to be placed in service 1114. While in service by a customer, the aircraft 1102 is scheduled for routine maintenance and service 1116 (which may also include modification, reconfiguration, refurbishment, and so on).

Each of the processes of the illustrative method 1100 may be performed or carried out by a system integrator, a third party, and/or an operator (e.g., a customer). For the purposes of this description, a system integrator may include, without limitation, any number of aircraft manufacturers and major-system subcontractors; a third party may include, without limitation, any number of vendors, subcontractors, and suppliers; and an operator may be an airline, leasing company, military entity, service organization, and so on.

As shown in FIG. 7, the aircraft 1102 produced by the illustrative method 100 may include an airframe 1118 with a plurality of high-level systems and an interior 1122. Examples of high-level systems include one or more of a propulsion system 1124, an electrical system 1126, a hydraulic system 1128, and an environmental system 1130. Any number of other systems may be included. Although an aerospace example is shown, the principles of the invention may be applied to other industries, such as the maritime and automotive industries or any other industry which utilizes test equipment.

Apparatus and methods shown or described herein may be employed during any one or more of the stages of the manufacturing and service method 1100. For example, components or subassemblies corresponding to component and subassembly manufacturing 1108 may be fabricated or manufactured in a manner similar to components or subassemblies produced while the aircraft 1102 is in service. Also, one or more aspects of the apparatus, method, or combination thereof may be utilized during the production states 1108 and 1110, for example, by substantially expediting assembly of or reducing the cost of an aircraft 1102. Similarly, one or more aspects of the apparatus or method realizations, or a combination thereof, may be utilized, for example and without limitation, while the aircraft 1102 is in service, e.g., maintenance and service 1116.

The aspects of the present disclosure provide a test system in which additions, subtractions and/or reconfigurations to an existing test system are easily made. This provides the ability to address future testing needs quickly and cost effectively. The interface devices 120 and circuit cards attached thereto can be inserted and removed through the front panel of the frame 100 where the interface devices are mounted substantially directly to the frame 100 without any intervening structure. This modular aspect of the test system allows for maintenance through the front panel of the frame 100 and utilizes only a simple cable connector interface, to the unit under test, which is accessible by the end user. The interface devices 120 can be removed from their respective circuit cards so that the circuit cards and/or the interface devices 120 can be replaced and/or repaired. This may allow for quick expansion and/or reconfiguration of the test system in the field as the circuit card(s) can be removed directly out of the front panel of the frame 100 and replacement circuit card(s) can be inserted through the same opening. The aspects of the present disclosure provide a more defined function to the test chassis 110 and an easier to use, less costly interface option that will in turn make the test chassis 110 easier to work with as the connection between the test system and the unit under test is made with the necessary cables for connecting the unit under test to the connectors on the interface devices 120 without any application specific interface adapters.

In accordance with one or more aspects of the present disclosure a method is provided. The method includes disposing a test chassis within an environmentally protective chassis; affixing an interface device to a circuit card; and installing the interface device and circuit card as a unit to the environmentally protective chassis such that the circuit card engages the test chassis and the interface device directly engages an interface device seating surface of the environmentally protective chassis.

In accordance with one or more aspects of the present disclosure wherein the interface device directly engages the environmentally protective chassis substantially without an intervening environmental interface or environmental interface plane located between the interface device seating surface and the test chassis.

In accordance with one or more aspects of the present disclosure the method includes providing, with the environmentally protective chassis, a closed protective environment for the test chassis and one or more module interfaces associated with the test chassis, where the circuit card engages a respective module interface.

In accordance with one or more aspects of the present disclosure affixing the interface device to the circuit card includes aligning the circuit card using connectors of the interface device and mechanically attaching the circuit card to the interface device.

In accordance with one or more aspects of the present disclosure the method further includes forming a seal between the interface device and the environmentally protective chassis to form a closed or sealed environment within the environmentally protective chassis.

In accordance with one or more aspects of the present disclosure an apparatus is provided. The apparatus includes an environmentally protective chassis configured to house and environmentally protect a test chassis having one or more module interfaces, the environmentally protective chassis having an interface device seating surface with sealable apertures formed in the interface device seating surface; and at least one interface device configured for connection to the test chassis and including at least one interface connector corresponding to connectors of a unit under test, the at least one interface device being configured for insertion through one or more of the sealable apertures and direct coupling to the interface device seating surface of the environmentally protective chassis without any intervening environmental interface or environmental interface plane located between the interface device seating surface and the test chassis.

In accordance with one or more aspects of the present disclosure the apparatus is a test station.

In accordance with one or more aspects of the present disclosure the environmentally protective chassis is configured for insertion into an equipment rack.

In accordance with one or more aspects of the present disclosure the interface device includes a first end plate configured with electrical connectors and mechanical attachment members configured to align and attach a circuit card to the interface device.

In accordance with one or more aspects of the present disclosure the interface device includes a second end plate on which the at least one interface connector is affixed.

In accordance with one or more aspects of the present disclosure the interface device includes a frame having one or more protrusions extending from the second end plate, the one or more protrusions being configured for grasping and effecting the insertion and removal of the interface device from the environmentally protective chassis.

In accordance with one or more aspects of the present disclosure the interface device includes a connecting member for coupling each interface connector to a corresponding circuit card connector of the circuit card.

In accordance with one or more aspects of the present disclosure the interface device includes a frame having a cavity and a cover removably attached to the frame for sealing the cavity, one or more of at least a portion of the interface connector, a portion of the circuit card connector and connecting member are disposed within the cavity.

In accordance with one or more aspects of the present disclosure the connecting member is a cable or wire having ends corresponding to the interface connector and the circuit card connector.

In accordance with one or more aspects of the present disclosure the circuit card connects the interface device to the test chassis.

In accordance with one or more aspects of the present disclosure the first end plate is configured for attachment to a PXI circuit card or a VXI circuit card.

In accordance with one or more aspects of the present disclosure the direct coupling between the interface device and the environmentally protective chassis is a direct mechanical coupling that causes an insertion and removal of the circuit card to and from the test chassis.

In accordance with one or more aspects of the present disclosure the interface device has a width corresponding to a width of one or more module interfaces of the test chassis.

In accordance with one or more aspects of the present disclosure the interface device seating surface and the at least one interface device are configured to form a seal when coupled together for closing or sealing an interior of the environmentally protective chassis.

In accordance with one or more aspects of the present disclosure the apparatus further comprises at least one blank panel configured to seal one or more of the sealable apertures.

Different examples and aspects of the apparatus and methods are disclosed herein that include a variety of components, features, and functionality. It should be understood that the various examples and aspects of the apparatus and methods disclosed herein may include any of the components, features, and functionality of any of the other examples and aspects of the apparatus and methods disclosed herein in any combination, and all of such possibilities are intended to be within the spirit and scope of the present disclosure.

Many modifications and other examples of the disclosure set forth herein will come to mind to one skilled in the art to which the disclosure pertains having the benefit of the teachings presented in the foregoing descriptions and the associated drawings.

Therefore, it is to be understood that the disclosure is not to be limited to the specific embodiments disclosed and that modifications and other embodiments are intended to be included within the scope of the present disclosure. Moreover, although the foregoing descriptions and the associated drawings describe example embodiments in the context of certain illustrative combinations of elements and/or functions, it should be appreciated that different combinations of elements and/or functions may be provided by alternative implementations without departing from the scope of the appended claims.

What is claimed is:

1. A method comprising:
   disposing a test chassis within an environmentally protective chassis where the environmentally protective chassis has an interface device seating surface with sealable apertures formed in the interface device seating surface;
   affixing an interface device to a circuit card; and
   installing the interface device and circuit card as a unit to the environmentally protective chassis such that the circuit card engages the test chassis and the interface device directly engages an interface device seating surface of the environmentally protective chassis so that the direct engagement between the interface device and the interface device seating surface forms a seal that seals the sealable apertures.

2. The method of claim 1, wherein the interface device directly engages the environmentally protective chassis substantially without an intervening environmental interface or environmental interface plane located between the interface device seating surface and the test chassis.

3. The method of claim 1, further comprising providing, with the environmentally protective chassis, a closed protective environment for the test chassis and one or more module interfaces associated with the test chassis, where the circuit card engages a respective module interface.

4. The method of claim 1, wherein affixing the interface device to the circuit card includes aligning the circuit card using connectors of the interface device and mechanically attaching the circuit card to the interface device.

5. The method of claim 1, wherein forming the seal between the interface device and the environmentally protective chassis forms a closed or sealed environment within the environmentally protective chassis.

6. An apparatus comprising:
an environmentally protective chassis house and environmentally protect a test chassis having one or more module interfaces, the environmentally protective chassis having an interface device seating surface with sealable apertures formed in the interface device seating surface; and
at least one interface device configured for connection to the test chassis and including at least one interface connector corresponding to connectors of a unit under test, the at least one interface device being configured for insertion through one or more of the sealable apertures and direct coupling to the interface device seating surface of the environmentally protective chassis, without any intervening environmental interface or environmental interface plane located between the interface device seating surface and the test chassis, so that the direct coupling between the at least one interface device and the interface device seating surface forms a seal that seals the sealable apertures.

7. The apparatus of claim 6, wherein the apparatus is a test station.

8. The apparatus of claim 6, wherein the environmentally protective chassis is configured for insertion into an equipment rack.

9. The apparatus of claim 6, wherein the direct coupling between the at least one interface device and the environmentally protective chassis is a direct mechanical coupling that causes an insertion and removal of a circuit card, that is attached to a respective interface device, to and from the test chassis.

10. The apparatus of claim 6, wherein the at least one interface device has a width corresponding to a width of one or more module interfaces of the test chassis.

11. The apparatus of claim 6, wherein the seal is formed between the interface device seating surface and the at least one interface device when the interface device seating surface and the at least one interface device are coupled together for closing or sealing an interior of the environmentally protective chassis.

12. The apparatus of claim 6, further comprising at least one blank panel configured to seal one or more of the sealable apertures.

13. The apparatus of claim 6, wherein the at least one interface device includes a first end plate configured with electrical connectors and mechanical attachment members configured to align and attach a circuit card to a respective interface device.

14. The apparatus of claim 13, wherein the at least one interface device includes a second end plate on which the at least one interface connector is affixed.

15. The apparatus of claim 14, wherein the at least one inter face device includes a frame having one or more protrusions extending from the second end plate, the one or more protrusions being configured for grasping and effecting the insertion and removal of a respective interface device from the environmentally protective chassis.

16. The apparatus of claim 13, wherein the at least one inter face device includes a connecting member for coupling each interface connector to a corresponding circuit card connector of the circuit card.

17. The apparatus of claim 16, wherein the at least one interface device includes a frame having a cavity and a cover removably attached to the frame for sealing the cavity, one or more of at least a portion of the interface connector, a portion of the circuit card connector, external circuitry for the circuit card and connecting member are disposed within the cavity.

18. The apparatus of claim 16, wherein the connecting member is a cable or wire having ends corresponding to the interface connector and the circuit card connector.

19. The apparatus of claim 13, wherein the circuit card connects a respective interface device: to the teat chassis.

20. The apparatus of claim 13, wherein the first end plate is configured for attachment to a PXI circuit card or a VXI circuit card.

21. An apparatus comprising:
an environmentally protective chassis that houses and environmentally protects a test chassis having one or more module interfaces, the environmentally protective chassis having an interface device seating surface with sealable apertures formed in the interface device seating surface; and
at least one interface device configured for connection to the test chassis and including at least one interface connector corresponding to connectors of a unit under test, the at least one interface device being configured for insertion through one or more of the sealable apertures and direct coupling to the interface device seating surface of the environmentally protective chassis without any intervening environmental interface or environmental interface plane located between the interface device seating surface and the test chassis;
wherein the at least one interface device includes a first end plate configured with electrical connectors and mechanical attachment members configured to align and attach a circuit card to a respective interface device.

22. The apparatus of claim 21, wherein the at least one interface device includes a second end plate on which the at least one interface connector is affixed.

23. The apparatus of claim 14, wherein the at least one interface device includes a frame having one or more protrusions extending from the second end plate, the one or more protrusions being configured for grasping and effecting the insertion and removal of the at least one interface device from the environmentally protective chassis.

24. The apparatus of claim 21 wherein the at least one interface device includes a connecting member for coupling each interface connector to a corresponding circuit card connector of the circuit card.

25. The apparatus of claim 24, wherein the at least one interface device includes a frame having a cavity and a cover removably attached to the frame for sealing the cavity, one or more of at least a portion of the interface connector, a portion of the circuit card connector, external circuitry for the circuit card and connecting member are disposed within the cavity.

26. The apparatus of claim 24, wherein the connecting member is a cable or wire having ends corresponding to the interface connector and the circuit card connector.

27. The apparatus of claim 21, wherein the circuit card connects a respective interface device to the test chassis.

28. The apparatus of claim 21, wherein the first end plate is configured for attachment to a PXI circuit card or a VXI circuit card.

29. A method comprising:
disposing test chassis within an environmental protective chassis;
affixing an interface device to a circuit card; and
installing the interface device and circuit card as a unit to the environmentally protective chassis such that the circuit card engages the test chassis and the interface device directly engages an interface device seating surface the environmentally protective chassis
wherein affixing the interface device to the circuit card includes aligning the circuit card using connectors of the interface device and mechanically attaching the circuit card to the interface device.

30. The method of claim 29, wherein aligning and attaching the circuit card to the interface device includes aligning the circuit card with electrical connectors of a first end plate of the interface device and attaching the circuit card with mechanical attachment members of the first end plate of the interface device.

31. The method of claim 30, wherein the interface device includes at least one interface connector corresponding to connectors of a unit under test, the method further comprising affixing the at least one interface connector on a second end plate of the interface device.

32. The method of claim 31, wherein the interface device includes a frame having one or more protrusions extending from the second end plate, the method further comprising grasping and effecting, with the one or more protrusions, the insertion and removal of the interface device from the environmentally protective chassis.

33. The method of claim 30, wherein the interface device includes a connecting member, the method further comprising coupling each interface connector to a corresponding circuit card connector of the circuit card with the connecting member.

34. The method of claim 30, wherein the circuit card connects the interface device to the test chassis.

35. The method of claim 30, wherein the first end plate is configured for attachment to a PXI circuit card or a VXI circuit card.

* * * * *